US012669555B2

(12) United States Patent
Yanagida et al.

(10) Patent No.: US 12,669,555 B2
(45) Date of Patent: Jun. 30, 2026

(54) IMAGE OUTPUT APPARATUS, METHOD, PROGRAM, AND RECORDING MEDIUM

(71) Applicant: ADVANTEST CORPORATION, Tokyo (JP)

(72) Inventors: Tomonori Yanagida, Miyagi (JP); Yuji Ogata, Miyagi (JP)

(73) Assignee: ADVANTEST CORPORATION, Tokyo (JP)

( * ) Notice: Subject to any disclaimer, the term of this patent is extended or adjusted under 35 U.S.C. 154(b) by 172 days.

(21) Appl. No.: 18/720,061

(22) PCT Filed: Jan. 23, 2023

(86) PCT No.: PCT/JP2023/001949
§ 371 (c)(1),
(2) Date: Jun. 14, 2024

(87) PCT Pub. No.: WO2023/203820
PCT Pub. Date: Oct. 26, 2023

(65) Prior Publication Data

US 2025/0044377 A1 Feb. 6, 2025

(30) Foreign Application Priority Data

Apr. 20, 2022 (JP) ................................ 2022-069406

(51) Int. Cl.
*G01R 33/02* (2006.01)
*G01N 27/72* (2006.01)

(52) U.S. Cl.
CPC ......... *G01R 33/0206* (2013.01); *G01N 27/72* (2013.01)

(58) Field of Classification Search
CPC ..... G01R 33/0206; G01R 33/02; G01N 27/72
(Continued)

(56) References Cited

U.S. PATENT DOCUMENTS

| | | | |
|---|---|---|---|
| 2007/0163367 A1 | 7/2007 | Sherman et al. | |
| 2009/0189603 A1 | 7/2009 | Sherman et al. | |

(Continued)

FOREIGN PATENT DOCUMENTS

| | | | |
|---|---|---|---|
| CN | 111158055 A * | 5/2020 | ......... G01R 33/0029 |
| JP | 2002-355264 | 12/2002 | |

(Continued)

OTHER PUBLICATIONS

Jiawei Huang et al., "IM6D: Magnetic Tracking System with 6-DOF Passive Markers for Dexterous 3D Interaction and Motion", ACM Transactions on Graphics, 2015.11, vol. 34, No. 6, Article 217, pp. 1-10.

(Continued)

*Primary Examiner* — Arleen M Vazquez
*Assistant Examiner* — Robert P Alejnikov, Jr.
(74) *Attorney, Agent, or Firm* — Greenblum & Bernstein, P.L.C.

(57) ABSTRACT

An image output apparatus includes a signal source specifying section, and a signal source image adding section. The signal source specifying section is arranged to receive measurement results from a plurality of sensors that receive, from a plurality of signal sources, signals represented by vectors each having a predetermined direction and measure triaxial components orthogonal to each other to specify positions of the signal sources and the directions of the vectors. The signal source image adding section is arranged to add images showing the signal sources to portions of an imaging result from an imaging section arranged to image the signal sources, the portions corresponding to the positions of the signal sources that are specified by the signal source specifying section.

16 Claims, 11 Drawing Sheets

(58) Field of Classification Search
USPC .......................................................... 324/244
See application file for complete search history.

(56) References Cited

U.S. PATENT DOCUMENTS

| | | | | |
|---|---|---|---|---|
| 2018/0284310 | A1* | 10/2018 | Kawano | G01R 33/063 |
| 2019/0192044 | A1 | 6/2019 | Ravi et al. | |
| 2020/0149862 | A1* | 5/2020 | Luo | G05D 1/101 |
| 2020/0222016 | A1 | 7/2020 | Pan et al. | |
| 2022/0104783 | A1 | 4/2022 | Pan et al. | |
| 2023/0023448 | A1 | 1/2023 | Ravi et al. | |

FOREIGN PATENT DOCUMENTS

| | | | | | |
|---|---|---|---|---|---|
| JP | 2003222664 | A | * | 8/2003 | |
| JP | 2007-170976 | | | 7/2007 | |
| JP | 2007187656 | A | * | 7/2007 | A61B 34/20 |
| JP | 2012-133591 | | | 7/2012 | |
| JP | 2019-535339 | | | 12/2019 | |
| JP | 2020-534082 | A | | 11/2020 | |
| JP | 2021-87756 | A | | 6/2021 | |
| JP | 2021087756 | A | * | 6/2021 | |

OTHER PUBLICATIONS

Yamauchi et al., “Study on magnetic field visualization materials using AR and triaxial magnetic sensor”, IEE congress, 2019, p. 10, along with a corresponding English translation.

International Search Report Issued in International Patent Application No. PCT/JP2023/001949, dated Apr. 4, 2023, along with an English translation thereof.

* cited by examiner

IMAGE OUTPUT APPARATUS, METHOD, PROGRAM, AND RECORDING MEDIUM

TECHNICAL FIELD

The present invention relates to visualization of a signal source that generates a signal such as a magnetic field.

BACKGROUND ART

Some objects include signal sources that generate a signal such as a magnetic field. Such signal sources include, for example, a magnetic marker (such as a permanent magnet) and a magnetic material (such as a rebar).

It is noted that there have conventionally been known various techniques for measuring and displaying the position of a magnetic signal source (see Patent Literatures 1, 3, 4, and Non-Patent Literatures 1, 2, for example). There have also been known various techniques for measuring and displaying the position of not a magnetic signal source but a sound source (see Patent Literature 2, for example).

CITATION LIST

Patent Literature

Patent Literature 1: Japanese Patent Application Publication No. 2019-535339

Patent Literature 2: Japanese Patent Application Publication No. 2012-133591

Patent Literature 3: Japanese Patent Application Publication No. 2002-355264

Patent Literature 4: Japanese Patent Application Publication No. 2007-170976

Non-Patent Literature

Non-Patent Literature 1: Jiawei Huang and 4 others. "IM6D: Magnetic Tracking System with 6-DOF Passive Markers for Dexterous 3D Interaction and Motion", ACM Transactions on Graphics, 2015.11, Vol. 34, No. 6, Article 217, p. 1-10

Non-Patent Literature 2: Yamauchi and 4 others, "Study on magnetic field visualization materials using AR and triaxial magnetic sensor", TEE congress, 2019, p. 10

SUMMARY OF THE INVENTION

Technical Problem

However, even by visually observing or imaging an object that includes a signal source, the position of the signal source or the direction of the signal vector cannot be known.

It is hence an object of the present invention to visualize a signal source such as a magnetic field.

Means for Solving the Problem

According to the present invention, an image output apparatus, includes: a signal source specifying section arranged to receive measurement results from a plurality of sensors that receive, from a plurality of signal sources, signals represented by vectors each having a predetermined direction and measure triaxial components orthogonal to each other to specify positions of the signal sources and the directions of the vectors; and a signal source image adding section arranged to add images showing the signal sources to portions of an imaging result from an imaging section arranged to image the signal sources, the portions corresponding to the positions of the signal sources that are specified by the signal source specifying section.

According to the thus constructed image output apparatus, a signal source specifying section is arranged to receive measurement results from a plurality of sensors that receive, from a plurality of signal sources, signals represented by vectors each having a predetermined direction and measure triaxial components orthogonal to each other to specify positions of the signal sources and the directions of the vectors. A signal source image adding section is arranged to add images showing the signal sources to portions of an imaging result from an imaging section arranged to image the signal sources, the portions corresponding to the positions of the signal sources that are specified by the signal source specifying section.

According to the image output apparatus of the present invention, the signal source image adding section may be arranged to further add a coordinate axis to the imaging result.

According to the image output apparatus of the present invention, the images showing the signal sources may indicate the directions of the vectors.

According to the image output apparatus of the present invention, the signal source image adding section may be arranged to add images showing the signal sources at a plurality of time points.

According to the image output apparatus of the present invention, the signal source image adding section may be arranged to output, based on the coordinates of the positions of the signal sources and the coordinate of a viewpoint of imaging by the imaging section, an additional result when the viewpoint is changed.

According to the image output apparatus of the present invention, the measurement results from the sensors may be each proportional to a sum of the triaxial components of each vector multiplied by a first coefficient, and the signal source specifying section may include: a spectrum deriving section arranged to derive a spectrum obtained based on a sum of the measurement results from the sensors and a value obtained by multiplying the first coefficient by a second coefficient, the spectrum having local maximum values in voxels in which the signal sources that output the signals exist; an direction deriving section arranged to derive the directions of the vectors based on the second coefficient that is used to obtain the spectrum; and a position deriving section arranged to derive the positions of the voxels in which the signal sources exist based on the spectrum.

According to the image output apparatus of the present invention, the position deriving section may be arranged to derive the positions of the voxels in which the signal sources exist based on the maximum of a value that the spectrum has in each voxel.

According to the image output apparatus of the present invention, the signal source specifying section may include: a relational matrix recording section arranged to record a relational matrix that represents a relationship between the measurement results summarized per axis by a number of the sensors and the vectors; and a position/vector deriving section arranged to derive the positions of the signal sources and the vectors that offer a minimum cost function based on the measurement results and the relational matrix, wherein the components of the vectors may be summarized per the axis by a number of grid points in a space at which the signal sources are positioned, the cost function may be a sum of an error function and a normalization term, the error function may represent the positions of the signal sources and an error between a true value of each vector and a candidate value for the true value, the normalization term may be a function of a normalization parameter and an L1 norm of each vector, and the positions of the signal sources and the vectors may be specified based on a result of derivation by the position/vector deriving section.

According to the image output apparatus of the present invention, the result of derivation by the position/vector deriving section may be specified as the positions of the signal sources and the vectors.

According to the present invention, the image output apparatus may further include: a clustering section arranged to classify the positions of the signal sources that are derived by the position/vector deriving section into clusters of a number of the signal sources; a weighted center deriving section arranged to derive a weighted center of the signal sources for each of the clusters; and a weighted averaging section arranged to average, for each of the clusters, the vectors that are derived by the position/vector deriving section in inverse proportion to distances between the signal sources and the weighted center, wherein the positions of the signal sources may be each specified as the weighted center, and the vectors may be each specified as a result of derivation by the weighted averaging section.

According to the image output apparatus of the present invention, the classification into the clusters may be performed according to a K-means method.

According to the present invention, an image output method, includes: receiving measurement results from a plurality of sensors that receive, from a plurality of signal sources, signals represented by vectors each having a predetermined direction and measure triaxial components orthogonal to each other to specify positions of the signal sources and the directions of the vectors; and adding images showing the signal sources to portions of an imaging result from an imaging section arranged to image the signal sources, the portions corresponding to the positions of the signal sources that are specified by the receiving of the measurement results.

The present invention is a program of instructions for execution by a computer to perform an image output process, the image output process, including: receiving measurement results from a plurality of sensors that receive, from a plurality of signal sources, signals represented by vectors each having a predetermined direction and measure triaxial components orthogonal to each other to specify positions of the signal sources and the directions of the vectors; and adding images showing the signal sources to portions of an imaging result from an imaging section arranged to image the signal sources, the portions corresponding to the positions of the signal sources that are specified by the receiving of the measurement results.

The present invention is a non-transitory computer-readable medium including a program of instructions for execution by a computer to perform an image output process, the image output process, including: receiving measurement results from a plurality of sensors that receive, from a plurality of signal sources, signals represented by vectors each having a predetermined direction and measure triaxial components orthogonal to each other to specify positions of the signal sources and the directions of the vectors; and adding images showing the signal sources to portions of an imaging result from an imaging section arranged to image the signal sources, the portions corresponding to the positions of the signal sources that are specified by the receiving of the measurement results.

MODES FOR CARRYING OUT THE INVENTION

A description will now be given of embodiments of the present invention referring to drawings.

First Embodiment

Figure 1:
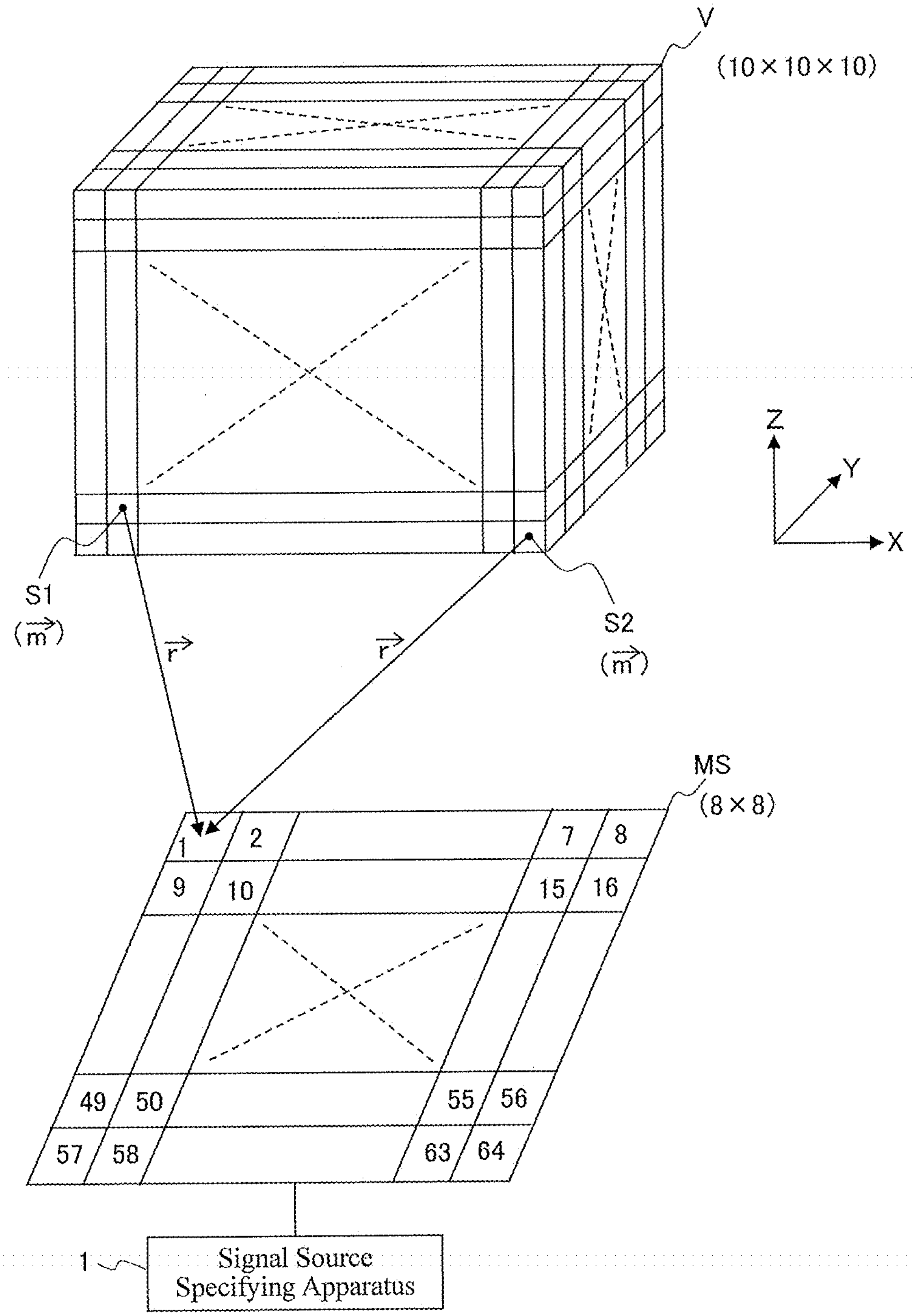
FIG. 1 is a perspective view showing voxels V and magnetic sensors MS according to a first embodiment of the present invention.
Figure 2:
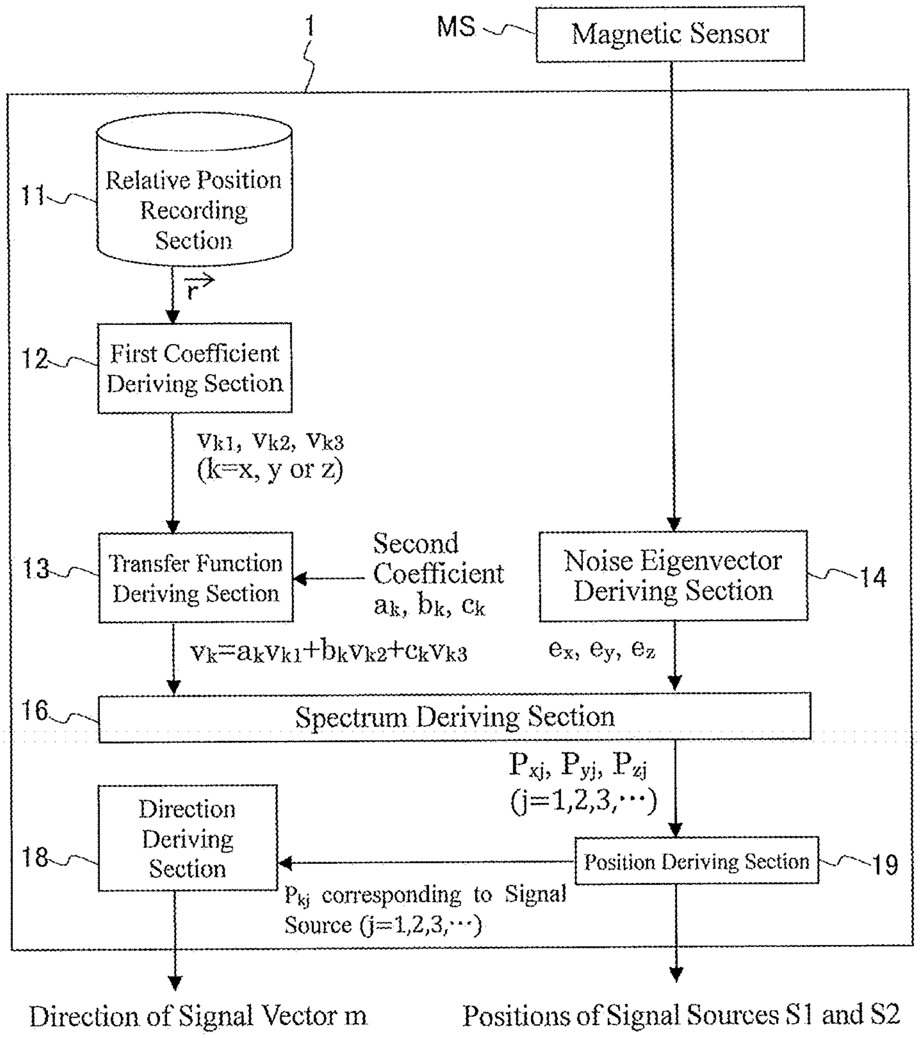
FIG. 2 is a functional block diagram showing a configuration of a signal source specifying apparatus 1 according to the first embodiment of the present invention.

FIG. 1 is a perspective view showing voxels V and magnetic sensors MS according to a first embodiment of the present invention. FIG. 2 is a functional block diagram showing the configuration of a signal source specifying apparatus 1 according to the first embodiment of the present invention.

Referring to FIG. 1, signal sources S1 and S2 output signals. The signals are each represented by a vector “m” having a predetermined direction. The vector “m” is, for example, a magnetic dipole moment. It is noted that the number of signal sources is, for example, two, but may be three or more as long as it is less than the number of magnetic sensors MS. Note here that signals output from the signal sources have their respective frequencies or phases different from each other.

The positions within a space at which the signal sources S1 and S2 exist are also represented by voxels V (e.g. 10×10×10=1000 voxels). The signal sources S1 and S2 are positioned within their respective different voxels V. It is noted that the 1000 voxels V are denoted as V1 to V1000.

Multiple (e.g., 64 in 8 rows and 8 columns) magnetic sensors MS are arranged to receive signals (e.g., magnetic dipole moments) and measure X, Y, Z triaxial components $B_x$, $B_y$, $B_z$ orthogonal to each other. It is noted that the 64 magnetic sensors MS are denoted as MS1 to MS64.

Here given a directional vector "r" from a signal source (magnetic dipole) to a magnetic sensor MS, the magnetic flux density B (function of the vector "r") measured by the magnetic sensor MS is expressed by Biot-Savart's law as in formula (1), where $\mu_0$ is the magnetic constant. The vector "r" can also represent the positional relationship between each of the voxels V (V1 to V1000) and each of the magnetic sensors MS (MS1 to MS64).

$$B(\vec{r}) = \frac{\mu_0}{4\pi}\left\{\frac{3(\vec{m}\cdot\vec{r})}{|\vec{r}|^5}\vec{r} - \frac{\vec{m}}{|\vec{r}|^3}\right\} \tag{1}$$

From formula (1), $B_x$ is expressed as in formula (2) below, where $r_x$, $r_y$, $r_z$ are x-, y-, z-components of the vector "r", respectively, and also $m_x$, $m_y$, $m_z$ are x-, y-, z-components of the vector "m", respectively.

$$B_x = \frac{\mu_0}{4\pi}\left\{\left(\frac{3r_x^2}{|\vec{r}|^5} - \frac{1}{|\vec{r}|^3}\right)m_x + \frac{3r_xr_y}{|\vec{r}|^5}m_y + \frac{3r_zr_x}{|\vec{r}|^5}m_z\right\} \tag{2}$$

$$B_x = \frac{\mu_0}{4\pi}(v_{x1}m_x + v_{x2}m_y + v_{x3}m_z) \tag{2'}$$

Here, when the coefficients of $m_x$, $m_y$, and $m_z$ in formula (2) are replaced, respectively, with $v_{x1}$, $v_{x2}$, and $v_{x3}$, the formula (2) is expressed as in formula (2'). The measurement result $B_x$ from each magnetic sensor MS is then proportional to the sum ($v_{x1}$ $m_x$+$v_{x2}m_y$+$v_{x3}m_z$) of the X, Y, Z triaxial components $m_x$, $m_y$, and $m_z$ of the vector "m" multiplied, respectively, by $v_{x1}$, $v_{x2}$, and $v_{x3}$ (first coefficients).

From formula (1), $B_y$ is expressed as in formula (3) below.

$$B_y = \frac{\mu_0}{4\pi}\left\{\frac{3r_xr_y}{|\vec{r}|^5}m_x + \left(\frac{3r_y^2}{|\vec{r}|^5} - \frac{1}{|\vec{r}|^3}\right)m_y + \frac{3r_yr_z}{|\vec{r}|^5}m_z\right\} \tag{3}$$

$$B_y = \frac{\mu_0}{4\pi}(v_{y1}m_x + v_{y2}m_y + v_{y3}m_z) \tag{3'}$$

Here, when the coefficients of $m_x$, $m_y$, and $m_z$ in formula (3) are replaced, respectively, with $v_{y1}$, $v_{y2}$, and $v_{y3}$, the formula (3) is expressed as in formula (3'). The measurement result $B_y$ from each magnetic sensor MS is then proportional to the sum ($v_{y1}$ $m_x$+$v_{y2}m_y$+$v_{y3}m_z$) of the X, Y, Z triaxial components $m_x$, $m_y$, and $m_z$ of the vector "m" multiplied, respectively, by $v_{y1}$, $v_{y2}$, and $v_{y3}$ (first coefficients).

From formula (1), $B_z$ is expressed as in formula (4) below.

$$B_z = \frac{\mu_0}{4\pi}\left\{\frac{3r_zr_x}{|\vec{r}|^5}m_x + \frac{3r_yr_z}{|\vec{r}|^5}m_y + \left(\frac{3r_z^2}{|\vec{r}|^5} - \frac{1}{|\vec{r}|^3}\right)m_z\right\} \tag{4}$$

$$B_z = \frac{\mu_0}{4\pi}(v_{z1}m_x + v_{z2}m_y + v_{z3}m_z) \tag{4'}$$

Here, when the coefficients of $m_x$, $m_y$, and $m_z$ in formula (4) are replaced, respectively, with $v_{z1}$, $v_{z2}$, and $v_{z3}$, the formula (4) is expressed as in formula (4'). The measurement result $B_z$ from each magnetic sensor MS is then proportional to the sum ($v_{z1}$ $m_x$+$v_{z2}m_y$+$v_{z3}m_z$) of the X, Y, Z triaxial components $m_x$, $m_y$, and $m_z$ of the vector "m" multiplied, respectively, by $v_{z1}$, $v_{z2}$, and $v_{z3}$ (first coefficients).

It is noted that referring to formulae (2) to (4) and (2') to (4'), $v_{x1}$, $v_{x2}$, $v_{x3}$, $v_{y1}$, $v_{y2}$, $v_{y3}$, $v_{z1}$, $v_{z2}$, and $v_{z3}$ (first coefficients) are defined based on the vector "r".

Referring to FIG. 2, the signal source specifying apparatus 1 according to the first embodiment of the present invention includes a relative position recording section 11, a first coefficient deriving section 12, a transfer function deriving section 13, a noise eigenvector deriving section 14, a spectrum deriving section 16, a direction deriving section 18, and a position deriving section 19.

The signal source specifying apparatus 1 is arranged to receive measurement results from the multiple sensors MS1 to MS64 and derive the direction of the vector "m".

The relative position recording section 11 is arranged to record a vector "r" as a relative position between each of the 1000 voxels V and each of the magnetic sensors MS (MS1 to MS64).

The first coefficient deriving section 12 is arranged to read the vector "r" out of the relative position recording section 11 and derive first coefficients $v_{x1}$, $v_{x2}$, $v_{x3}$, $v_{y1}$, $v_{y2}$, $v_{y3}$, $v_{z1}$, $v_{z2}$, and $v_{z3}$ (see formulae (2) to (4) and (2') to (4')).

For example, the first coefficient $v_{x1}$ is expressed as in formula (5) below.

$$v_{x1} = \begin{pmatrix} v_{x1}(1,1) & \cdots & v_{x1}(1,1000) \\ \vdots & \ddots & \vdots \\ v_{x1}(64,1) & \cdots & v_{x1}(64,1000) \end{pmatrix} \tag{5}$$

The vector "r" is determined by the position of each voxel V and the position of each magnetic sensor MS and thereby has 1000×64 different candidate values. Accordingly, the first coefficient $v_{x1}$ also has 1000×64 different candidate values. In formula (5), the 1st row denotes $v_{x1}$ for the magnetic sensor MS1, the 2nd row denotes $v_{x1}$ for the magnetic sensor MS2, . . . , and the 64th row denotes $v_{x1}$ for the magnetic sensor MS64. Further, in formula (5), the 1st column denotes $v_{x1}$ for the voxel V1, the 2nd column denotes $v_{x1}$ for the voxel V2, . . . , and the 1000th column denotes $v_{x1}$ for the voxel V1000. For example, the element $v_{x1}$ (1, 1000) of the 1st row and the 1000th column in formula (5) denotes $v_{x1}$ for the magnetic sensor MS1 and the voxel V1000. That is, $v_{x1}$ (1, 1000) can be obtained by substituting the vector "r" as a directional vector from the voxel V1000 to the magnetic sensor MS1 into the coefficient of $m_x$ in formula (2).

The other first coefficients $v_{x2}$, $v_{x3}$, $v_{y1}$, $v_{y2}$, $v_{y3}$, $v_{z1}$, $v_{z2}$, and $v_{z3}$ also each have 1000×64 different candidate values.

The first coefficient $v_{x1}$ is normalized as in formula (6) below for subsequent processing, though may be used without normalization.

$$v_{x1}(h, n)/\left(v_{x1}(1, n)^2 + v_{x1}(2, n)^2 + \ldots + v_{x1}(64, n)^2\right)^{1/2} \tag{6}$$

Here, "h" and "n" represent row and column, respectively. That is, the first coefficient $v_{x1}$ of the h-th row and the n-th column is divided by the square root of the sum of the squares of the first coefficients $v_{x1}$ of the 1st, 2nd, . . . , 64th rows and the n-th column to be a new first coefficient $v_{x1}$ of the h-th row and the n-th column.

The other first coefficients $v_{x2}$, $v_{x3}$, $v_{y1}$, $v_{y2}$, $v_{y3}$, $v_{z1}$, $v_{z2}$, and $v_{z3}$ are also normalized similarly.

The first coefficient deriving section 12 is arranged to output the thus normalized first coefficients.

The noise eigenvector deriving section 14 is arranged to obtain eigenvectors of a noise subspace from the measurement results $B_x$, $B_y$, $B_z$ from each magnetic sensor MS according to the MUSIC method.

$X(t)_x$ is first obtained from the measurement result $B_x$ from each magnetic sensor MS as in formula (7) below, where "t" is the time of measurement. T represents transposition.

$$X(t)_x = \begin{pmatrix} B_{x1}(t1) & B_{x2}(t1) & \dots & B_{x64}(t1) \\ B_{x1}(t2) & B_{x2}(t2) & \dots & B_{x64}(t2) \\ \dots & \dots & \dots & \dots \\ B_{x1}(tN) & B_{x2}(tN) & \dots & B_{x64}(tN) \end{pmatrix}^T \quad (7)$$

$X(t)_x$ is a transposed matrix describing $B_x$ measured at time t1 in the 1st row, $B_x$ measured at time t2 in the 2nd row, . . . , $B_x$ measured at time tN in the Nth row and $B_x$ measured by the magnetic sensor M1 in the 1st column, $B_x$ measured by the magnetic sensor M2 in the 2nd column, . . . , $B_x$ measured by the magnetic sensor M64 in the 64th column.

$X(t)_x$ is used to obtain a correlation matrix as in formula (8) below.

$$E\{X(t)_x X(t)_x^T\} \quad (8)$$

Here, E represents the ensemble average. A matrix of 64 rows and 64 columns is obtained from formula (8). Eigenvalues and eigenvectors are then obtained of the correlation matrix obtained from formula (8). Among the thus obtained eigenvalues, the (two) ones for the number of the signal sources are large, while the remaining (64−2=62) eigenvalues are small. Eigenvectors ex of the noise subspace are then obtained correspondingly to the smaller eigenvalues. Each of the eigenvectors ex of the noise subspace is a vector of 64 rows and 1 column. 62 eigenvectors ex of the noise subspace exist correspondingly to the smaller eigenvalues.

It is noted that eigenvectors ey of the noise subspace can also be obtained similarly. First, $B_x$ in formula (7) is replaced with $B_y$ and $X(t)_x$ in formulae (7) and (8) is replaced with $X(t)_y$, and formula (8) is used to obtain a correlation matrix. Then, in a similar manner as above, eigenvectors ey of the noise subspace are obtained correspondingly to the smaller eigenvalues. Each of the eigenvectors ey of the noise subspace is a vector of 64 rows and 1 column. 62 eigenvectors ey of the noise subspace exist correspondingly to the smaller eigenvalues.

Eigenvectors ez of the noise subspace can also be obtained similarly. First, $B_x$ in formula (7) is replaced with $B_z$ and $X(t)_x$ in formulae (7) and (8) is replaced with $X(t)_z$, and formula (8) is used to obtain a correlation matrix. Then, in a similar manner as above, eigenvectors ez of the noise subspace are obtained correspondingly to the smaller eigenvalues. Each of the eigenvectors ez of the noise subspace is a vector of 64 rows and 1 column. 62 eigenvectors ez of the noise subspace exist correspondingly to the smaller eigenvalues.

The transfer function deriving section 13 is arranged to derive transfer functions $v_x$, $v_y$, and $v_z$ as in formulae (9), (10), and (11) below. The sum of the first coefficients $v_{x1}$, $v_{x2}$, and $v_{x3}$ multiplied, respectively, by the second coefficients $a_x$, $b_x$, and $c_x$ is obtained (see formula (9)). The derivation result is the transfer function $v_x$. The sum of the first coefficients $v_{y1}$, $v_{y2}$, and $v_{y3}$ multiplied, respectively, by the second coefficients $a_y$, $b_y$, and $c_y$ is obtained (see formula (10)). The derivation result is the transfer function $v_y$. The sum of the first coefficients $v_{z1}$, $v_{z2}$, and $v_{z3}$ multiplied, respectively, by the second coefficients $a_z$, $b_z$, and $c_z$ is obtained (see formula (11)). The derivation result is the transfer function $v_z$.

$$v_x = a_x v_{x1} + b_x v_{x2} + c_x v_{x3} \quad (9)$$

$$v_y = a_y v_{y1} + b_y v_{y2} + c_y v_{y3} \quad (10)$$

$$v_z = a_z v_{z1} + b_z v_{z2} + c_z v_{z3} \quad (11)$$

It is noted that the transfer functions $v_x$, $v_y$, and $v_z$ are the transfer functions in the MUSIC method. Also, the second coefficients may each be a value other than zero. For example, $a_x=b_x=c_x=1$ (i.e., $v_x=v_{x1}+v_{x2}+v_{x3}$) may be set, $a_y=b_y=1$ and $c_y=-1$ (i.e., $v_y=v_{y1}+v_{y2}-v_{y3}$) may be set, or $a_z=1$, $b_z=-1$, and $c_z=1$ (i.e., $v_z=v_{z1}-v_{z2}+v_{z3}$) may be set.

Note here that any one or two of the second coefficients may be zero. For example, $a_x=1$ and $b_x=c_x=0$ (i.e., $v_x=v_{x1}$) may be set or $a_x=b_x=1$ and $c_x=0$ (i.e., $v_x=v_{x1}+v_{x2}$) may be set.

It is here assumed that $(a_k, b_k, c_k)$ (where k=x, y, z) can have the following 13 different candidate combinations: (1, 0, 0), (0, 1, 0), (0, 0, 1), (1, 1, 0), (1, −1, 0), (0, 1, 1), (0, 1, −1), (1, 0, 1), (−1, 0, 1), (1, 1, 1), (−1, 1, 1), (1, −1, 1), and (1, 1, −1). $v_k$ consists of $v_{k1}$, $v_{k2}$, . . . , $v_{k13}$, accordingly.

For example, if $(a_x, b_x, c_x)=(1, 0, 0)$, then $v_x=v_{x1}$. If $(a_x, b_x, c_x)=(1, 1, 0)$, then $v_x=v_x4=v_{x1}+v_{x2}$. If $(a_x, b_x, c_x)=(1, 1, -1)$, then $v_x=v_{x13}=v_{x1}+v_{x2}-v_{x3}$.

For example, if $(a_y, b_y, c_y)=(1, 0, 0)$, then $v_y=v_{y1}$. If $(a_y, b_y, c_y)=(1, 1, 0)$, then $v_y=v_{y4}=v_{yy}+v_{y2}$. If $(a_y, b_y, c_y)=(1, 1, -1)$, then $v_y=v_{y13}=v_{y1}+v_{y2}-v_{y3}$.

For example, if $(a_z, b_z, c_z)=(1, 0, 0)$, then $v_z=v_{z1}$. If $(a_z, b_z, c_z)=(1, 1, 0)$, then $v_z=v_z4=v_{z1}+v_{z2}$. If $(a_z, b_z, c_z)=(1, 1, -1)$, then $v_z=v_z13=v_{z1}+v_{z2}-v_{z3}$.

The spectrum deriving section 16 is arranged to derive a spectrum having local maximum values within the voxels V in which the signal sources S1 and S2 exist. Such a spectrum is obtained according to the MUSIC method. The spectrum has two local maximum values correspondingly to the number of signal sources. It is noted that if the number of signal sources is three or more, the spectrum also has three or more local maximum values accordingly.

Spectrums are derived by the spectrum deriving section 16 based on (the eigenvectors ex, ey, ez of the noise subspace obtained from) the measurement results $B_x$, $B_y$, $B_z$ from each magnetic sensor MS and the sum of the first coefficients multiplied, respectively, by the second coefficients (i.e. transfer functions $v_x$, $v_y$, $v_z$) (formulae (9), (10), (11)). The spectrum deriving section 16 is arranged to derive spectrums based on the transfer functions $v_x$, $v_y$, $v_z$ output from the transfer function deriving section 13 and the eigenvectors ex, ey, ez of the noise subspace output from the noise eigenvector deriving section 14.

The spectrum deriving section 16 is arranged to derive the spectrum $P_{x1}$ as follows.

(1) There are 62 eigenvectors ex (of 64 rows and 1 column) in the noise subspace, and these vectors ex are arranged in 62 columns to be a matrix of 64 rows and 62 columns.

(2) the matrix ex is transposed and by which the transfer function $v_{x1}$ (a matrix of 64 rows and 1000 columns) is multiplied. That is, $ex^T v_{x1}$ is obtained. This is a matrix of 62 rows and 1000 columns.

(3) Each element of the matrix obtained in (2) is squared.

(4) The elements of the matrix obtained in (3) are summed for each column and arranged in a row to obtain a matrix of 1 row and 1000 columns. For example, (1, Q) element+(2, Q) element+ . . . +(62, Q) element of the matrix obtained in (3) results in the (1, Q) element of the matrix of 1 row and 1000 columns obtained in (4) (where Q is an integer of 1 to 1000).

(5) Each element of the matrix obtained in (4) is inverted to obtain a spectrum $P_{x1}$ (a matrix of 1 row and 1000 columns).

It is noted that the columns of the spectrum $P_{x1}$ corresponds, respectively, to the voxels V1 to V1000. The same applies to the other spectrums.

The spectrum deriving section 16 is also arranged to derive the spectrums $P_{x2}$, $P_{x3}$, . . . , $P_{x13}$. The spectrums $P_{x2}$, $P_{x3}$, . . . , $P_{x13}$ can be derived by replacing the transfer function $v_{x1}$ in (2) above, respectively, with $v_{x2}$, $v_{x3}$, . . . , $v_{x13}$.

The spectrum deriving section 16 is arranged to derive the spectrums $P_{y1}$, $P_{y2}$, $P_{y3}$, . . . , $P_{y13}$. The spectrums $P_{y1}$, $P_{y2}$, $P_{y3}$, . . . , $P_{y13}$ can be derived by replacing the eigenvector ex of the noise subspace in (1) above with ey and replacing the transfer function $v_{x1}$ in (2) above, respectively, with $v_{y1}$, $v_{y2}$, $v_{y3}$, . . . , $v_{y13}$.

The spectrum deriving section 16 is arranged to derive the spectrums $P_{z1}$, $P_{z2}$, $P_{z3}$, . . . , $P_{z13}$. The spectrums $P_{z1}$, $P_{z2}$, $P_{z3}$, . . . , $P_{z13}$ can be derived by replacing the eigenvector ex of the noise subspace in (1) above with ez and replacing the transfer function $v_{x1}$ in (2) above, respectively, with $v_{z1}$, $v_{z2}$, $v_{z3}$, . . . , $v_{z13}$.

The position deriving section 19 is arranged to derive the positions of the voxels V in which the signal sources S1 and S2 exist based on the spectrums $P_{x1}$, $P_{x2}$, $P_{x3}$, . . . $P_{x13}$, $P_{y1}$, $P_{y2}$, $P_{y3}$, . . . , $P_{y13}$, $P_{z1}$, $P_{z2}$, $P_{z3}$, . . . , $P_{z13}$.

The spectrums output from the spectrum deriving section 16 are expressed as in formula (12) below.

$$PMatrix = \begin{pmatrix} P_{x1} \\ \vdots \\ P_{x13} \\ P_{y1} \\ \vdots \\ P_{y13} \\ P_{z1} \\ \vdots \\ P_{z13} \end{pmatrix} \tag{12}$$

The maximum values P of each spectrum within the respective voxels (i.e. the maximum values in each column of formula (12)) are obtained (see formula (13)).

$$P = \max(PMatrix) \tag{13}$$

Since the number of columns (corresponding to voxels) having local maximum values in P corresponds to the number of signal sources (2), the signal sources S1 and S2 exist within the voxels corresponding to the columns. A method of detecting columns with local maximum values will hereinafter be described.

Figure 3:
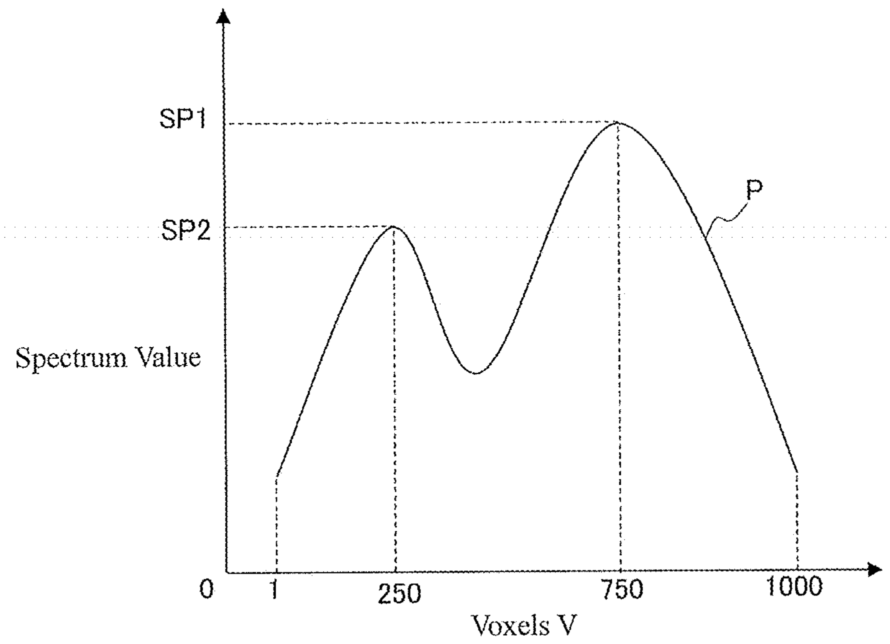
FIG. 3 is an example graph of the maximum values P.

FIG. 3 is an example graph of the maximum values P. In FIG. 3, the vertical axis represents the spectrum value, while the horizontal axis represents the voxels (V1 to V1000).

Referring to FIG. 3, it is provided that (the spectrum with) the maximum value P has a value of SP1 (local maximum value) within the voxel V750 and (the spectrum with) the maximum value P has a value of SP2 (local maximum value) within the voxel V250. Note here that SP1 is larger than SP2.

The position deriving section 19 is arranged to obtain the weighted center of the voxels having the maximum values P within a predetermined range from the maximum SP1 of the maximum values P (e.g. the maximum values P of 0.95SP1 or more), while increasing the predetermined range (e.g. by 0.05SP1 such that the maximum values P have 0.95SP1 or more→0.90SP1 or more→0.85SP1 or more→ . . . ), until the number of times of the weighted center changing over a predetermined amount added by 1 reaches the number of the signal sources (2).

The weighted center of the voxels in the vicinity of the maximum SP1 of the maximum values P is around the voxel V750. However, when the predetermined range extends from the maximum SP1 to include SP2, the weighted center of the voxels shifts lower from voxel V750. The weighted center then changes over a predetermined amount and the number of times (1) added by 1 reaches the number of the signal sources (2), where obtaining the weighted center of the voxels is completed.

Next, the voxels for which the weighted center is thus obtained is clustered into the number of the signal sources (2). For example, Kmeans clustering, which is unsupervised machine learning, is performed for labeling by the number of the signal sources.

Finally, the positions of the ones of the clustered voxels with the maximum spectrum are determined as the positions of the voxels in which the respective signal sources exist.

It is noted that the position deriving section 19 may further reduce the size of each voxel, based on the positions of the voxels in which the thus derived signal sources exist, to derive the positions of the voxels in which the respective signal sources exist. It is thus possible to calculate the positions of the voxels in which the signal sources exist with high accuracy and speed.

The direction deriving section 18 is arranged to receive $P_{kj}$ (where k=x, y, z and j=1, 2, 3, . . . ) corresponding to the signal sources S1 and S2 (i.e. having local maximum values in P) from the position deriving section 19. The direction deriving section 18 is further arranged to derive the direction of the vector "m" based on the second coefficients used to obtain $P_{kj}$ corresponding to the signal sources S1 and S2.

For example, it is assumed that $P_{x13}$ ($P_{y13}$ or $P_{z13}$) of the 750th column (voxel V750) and $P_{x4}$ ($P_{x4}$ or $P_{z4}$) of the 250th column (voxel V250) are provided as spectrums corresponding to the respective signal sources S1 and S2 from the position deriving section 19 to the direction deriving section 18.

The direction deriving section 18 then determines that the second coefficient ($a_k$, $b_k$, $c_k$) (where k=x, y, z) is (1, 1, −1), which is used to obtain $P_{x13}$ ($P_{y13}$ or $P_{z13}$) as the direction of the vector "m" at the signal source S1 within the voxel V750. Accordingly, the direction deriving section 18 derives the direction of the vector "m" at the signal source S1 within the voxel V750 to be parallel to the vector (1, 1, −1). Note here that the vector (1, 1, −1) is a vector having an X component of 1, a Y component of 1, and a Z component of −1.

The direction deriving section 18 further determines that the second coefficient ($a_k$, $b_k$, $c_k$) (where k=x, y, z) is (1, 1, 0), which is used to obtain $P_{x4}$ ($P_{x4}$ or $P_{z4}$) as the direction of the vector "m" at the signal source S2 within the voxel V250. Accordingly, the direction deriving section 18 derives the direction of the vector "m" at the signal source S2 within the voxel V250 to be parallel to the vector (1, 1, 0). Note here that the vector (1, 1, 0) is a vector having an X component of 1, a Y component of 1, and a Z component of 0.

Next will be described an operation according to the first embodiment of the present invention.

The first coefficient deriving section 12 reads the vector "r" out of the relative position recording section 11 and derives first coefficients $v_{x1}$, $v_{x2}$, $v_{x3}$, $v_{y1}$, $v_{y2}$, $v_{y3}$, $v_{z1}$, $v_{z2}$, and $v_{z3}$ (see formulae (2) to (4) and (2') to (4')).

It is noted that the first coefficients, which have 1000×64 different candidate values (see formula (5)), are normalized (see formula (6)) and provided to the transfer function deriving section 13.

The transfer function deriving section 13 derives transfer functions $v_x$, $v_y$, $v_z$ based on the first coefficients and the second coefficients $a_x$, $b_x$, $c_x$, $a_y$, $b_y$, $c_y$, $a_z$, $b_z$, $c_z$ (see formulae (9), (10), and (11)).

The noise eigenvector deriving section 14 obtains eigenvectors ex, ey, and ez of a noise subspace from the measurement results $B_x$, $B_y$, $B_z$ from each magnetic sensor MS according to the MUSIC method.

The spectrum deriving section 16 derives spectrums $P_{x1}$, $P_{x2}$, $P_{x3}$, . . . , $P_{x3}$, $P_{y1}$, $P_{y2}$, $P_{y3}$, . . . , $P_{y13}$, $P_{z1}$, $P_{z2}$, $P_{z3}$, . . . , $P_{z3}$ based on the transfer functions $v_x$, $v_y$, $v_z$ and the eigenvectors ex, ey, ez of the noise subspace (see formula (12)).

The position deriving section 19 obtains the maximum values P of each spectrum within the respective voxels (i.e. the maximum values in each column of formula (12)) (see formula (13) and FIG. 3). The voxels 250, 750 in which the signal sources S1 and S2 exist are derived based on the maximum values P.

The direction deriving section 18 derives the direction of the vector "m" based on the second coefficients used to obtain $P_{kj}$ corresponding to the signal sources S1 and S2.

The first embodiment of the present invention improves the accuracy of measurement of a signal such as a magnetic field.

For example, if the transfer function vi only consists of $v_{k1}$, $v_{k2}$, $v_{k3}$, the direction of the vector "m" can be measured only if in parallel with the X, Y, or Z direction. The direction of the vector "m", if in parallel with directions other than above (e.g. vector (1, 1, 0) (i.e. vector having an X component of 1, a Y component of 1, and a Z component of 0)), cannot be measured.

However, in accordance with the first embodiment of the present invention, since the transfer function $v_k$ consists of many types including $v_{k1}$, $v_{k2}$, $v_{k3}$, . . . , $v_{k13}$, the direction of the vector "m" can be measured even if not in parallel with the X, Y, and Z directions.

It is noted that the signal vector is not limited to a magnetic dipole moment, though have been descried as a magnetic dipole moment in the first embodiment of the present invention. The signal vector may be, for example, an electric dipole moment (vector "p").

The magnetic flux density B (function of the vector "r") measured by the magnetic sensor MS is expressed as in formula (14).

$$B(\vec{r}) = \frac{\mu_0}{4\pi}\frac{(\vec{p}\times\vec{r})}{|\vec{r}|^3} \tag{14}$$

From formula (14), $B_x$ is expressed as in formula (15) below, where $p_x$, $p_y$, $p_z$ are x-, y-, z-components of the vector "p", respectively.

$$B_x = \frac{\mu_0}{4\pi}\left(\frac{r_z}{|\vec{r}|^3}p_y - \frac{r_y}{|\vec{r}|^3}p_z\right) \tag{15}$$

$$B_x = \frac{\mu_0}{4\pi}(v_{x1}p_x + v_{x2}p_y + v_{x3}p_z) \tag{15'}$$

Here, when the coefficients of $p_x$, $p_y$, and $p_z$ in formula (15) are replaced, respectively, with $v_{x1}$, $v_{x2}$, and $v_{x3}$, the formula (15) is expressed as in formula (15'). The measurement result $B_x$ from each magnetic sensor MS is then proportional to the sum ($v_{x1}p_x+v_{x2}p_y+v_{x3}p_z$) of the X, Y, Z triaxial components $p_x$, $p_y$, and $p_z$ of the vector "p" multiplied, respectively, by $v_{x1}$, $v_{x2}$, and $v_{x3}$ (first coefficients). Note here that the component ($p_x$) of the vector in the same direction (X direction) as that of the component of the measurement result $B_x$ is zero, and the first coefficient $v_{x1}$ multiplying it is 1.

From formula (14), $B_y$ is expressed as in formula (16) below.

$$B_y = \frac{\mu_0}{4\pi}\left(\frac{r_x}{|\vec{r}|^3}p_z - \frac{r_z}{|\vec{r}|^3}p_x\right) \tag{16}$$

$$B_y = \frac{\mu_0}{4\pi}(v_{y1}p_x + v_{y2}p_y + v_{y3}p_z) \tag{16'}$$

Here, when the coefficients of $p_x$, $p_y$, and $p_z$ in formula (16) are replaced, respectively, with $v_{y1}$, $v_{y2}$, and $v_{y3}$, the formula (16) is expressed as in formula (16'). The measurement result $B_y$ from each magnetic sensor MS is then proportional to the sum ($v_{y1}p_x+v_{y2}p_y+v_{y3}p_z$) of the X, Y, and Z triaxial components $p_x$, $p_y$, and $p_z$ of the vector "p" multiplied, respectively, by $v_{y1}$, $v_{y2}$, and $v_{y3}$ (first coefficients). Note here that the component ($p_y$) of the vector in the same direction (Y direction) as that of the component of the measurement result $B_y$ is zero, and the first coefficient $v_{y2}$ multiplying it is 1.

From formula (14), $B_z$ is expressed as in formula (17) below.

$$B_z = \frac{\mu_0}{4\pi}\left(\frac{r_y}{|\vec{r}|^3}p_x - \frac{r_x}{|\vec{r}|^3}p_y\right) \tag{17}$$

$$B_z = \frac{\mu_0}{4\pi}(v_{z1}p_x + v_{z2}p_y + v_{z3}p_z) \tag{17'}$$

Here, when the coefficients of $p_x$, $p_y$, and $p_z$ in formula (17) are replaced, respectively, with $v_{z1}$, $v_{z2}$, and $v_{z3}$, the formula (17) is expressed as in formula (17'). The measurement result $B_Z$ from each magnetic sensor MS is then proportional to the sum ($v_{z1}p_x+v_{z2}p_y+v_{z3}p_z$) of the X, Y, and Z triaxial components $p_x$, $p_y$, and $p_z$ of the vector "p" multiplied, respectively, by vi, $v_{z2}$, and $v_{z3}$ (first coefficients). Note here that the component ($p_z$) of the vector in the same direction (Z direction) as that of the component of the measurement result $B_z$ is zero, and the first coefficient $v_{z3}$ multiplying it is 1.

The configuration and operation of the signal source specifying apparatus 1 is the same as those when the signal vector is a magnetic dipole moment (vector "m") and will not be described.

Second Embodiment

Figure 4:
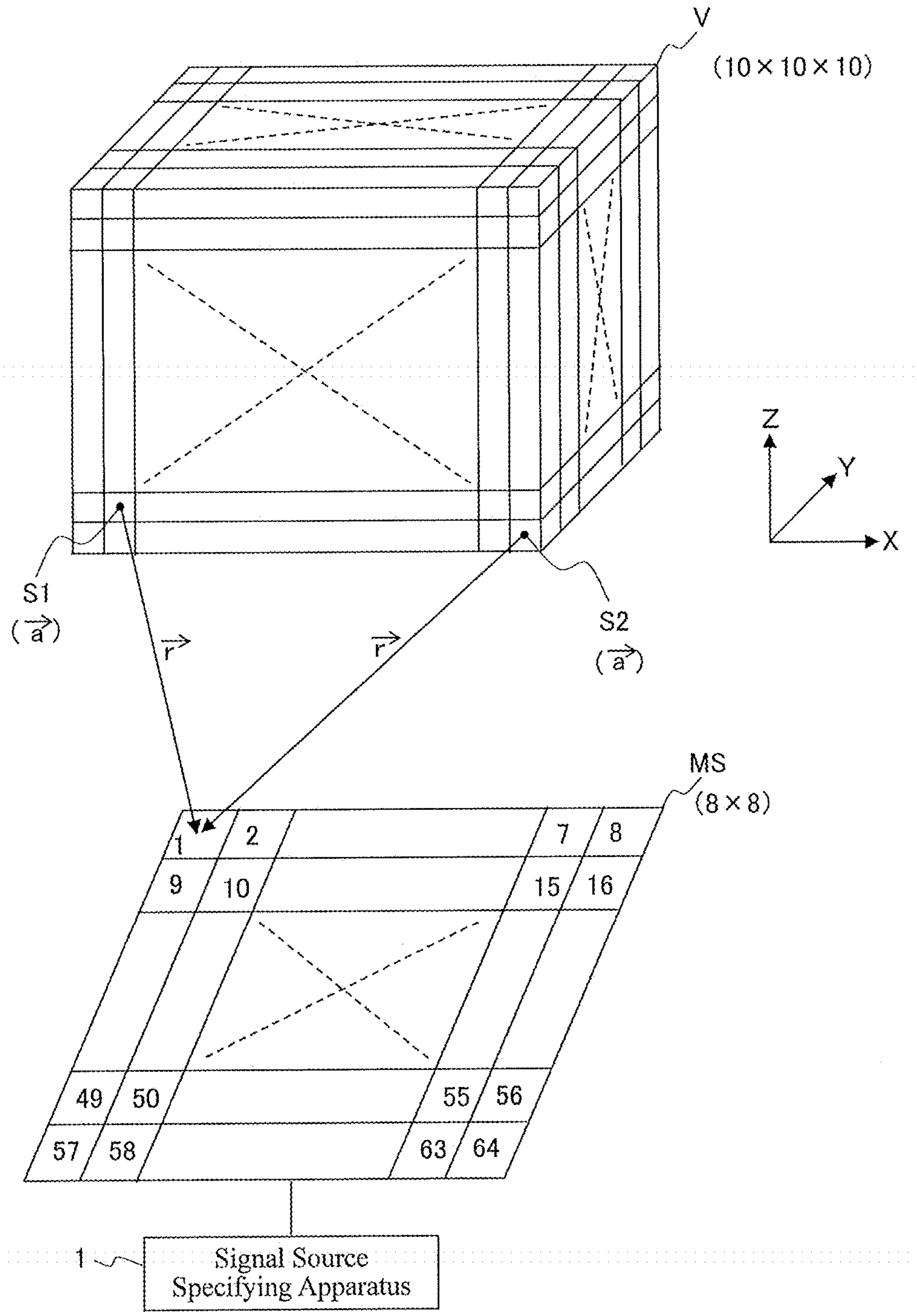
FIG. 4 is a perspective view showing voxels V and magnetic sensors MS according to a second embodiment of the present invention.
Figure 5:
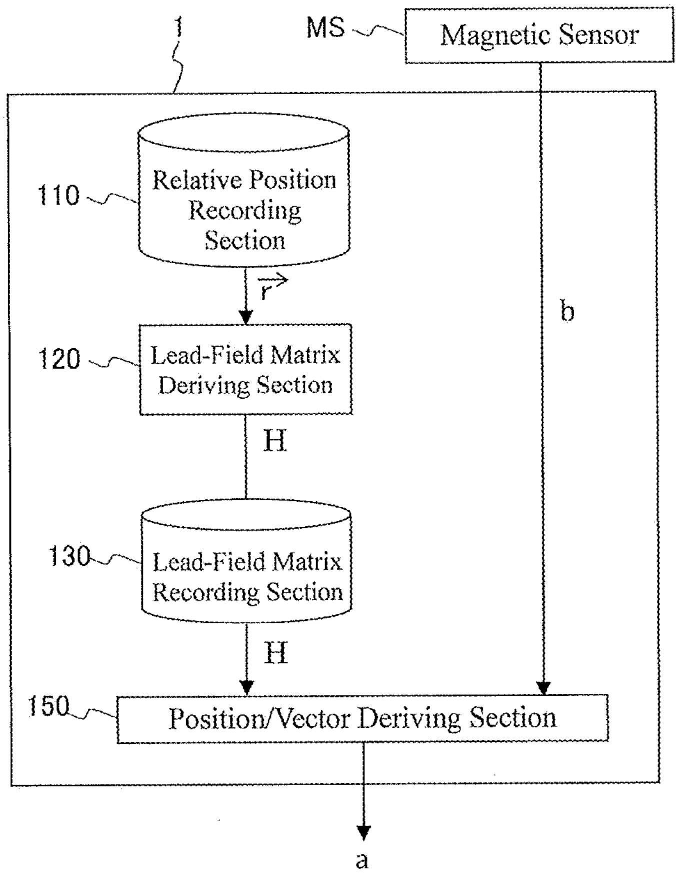
FIG. 5 is a functional block diagram showing a configuration of a signal source specifying apparatus 1 according to the second embodiment of the present invention.

FIG. 4 is a perspective view showing voxels V and magnetic sensors MS according to a second embodiment of the present invention. FIG. 5 is a functional block diagram showing the configuration of a signal source specifying apparatus 1 according to the second embodiment of the present invention.

Referring to FIG. 4, signal sources S1 and S2 output signals. The signals are each represented by a vector "a" having a predetermined direction. The vector "a" is, for example, a magnetic dipole moment. It is noted that the number of signal sources is, for example, two, but may be three or more as long as it is less than the number of magnetic sensors MS. It is noted that signals output from the signal sources may or may not have their respective frequencies or phases different from each other. That is, signals output from the signal sources may have the same frequency and phase. Further, signals output from the signal sources may be DC (direct current) signals.

The positions within a space at which the signal sources S1 and S2 exist are also represented by voxels V (e.g. 10×10×10=1000 voxels). The signal sources S1 and S2 are positioned within their respective different voxels V. It is noted that the 1000 voxels V are denoted as V1 to V1000.

Multiple (e.g., 64 in 8 rows and 8 columns) magnetic sensors MS are arranged to receive signals (e.g., magnetic dipole moments) and measure X, Y, Z triaxial components $b_x$, $b_y$, $b_z$ orthogonal to each other. It is noted that the 64 magnetic sensors MS are denoted as MS1 to MS64. Also, the signals are each represented by a vector "a" having a predetermined direction. The multiple magnetic sensors MS are arranged to receive signals from the multiple signal sources S1, S2.

Here given a directional vector "r" from a signal source (magnetic dipole) to a magnetic sensor MS, the magnetic flux density B (function of the vector "r") measured by the magnetic sensor MS is expressed by Biot-Savart's law as in formula (21), where $\mu_0$ is the magnetic constant. The vector "r" can also represent the positional relationship between each of the voxels V (V1 to V1000) and each of the magnetic sensors MS (MS1 to MS64).

$$B(\vec{r}) = \frac{\mu_0}{4\pi}\left\{\frac{3(\vec{a}\cdot\vec{r})}{|\vec{r}|^5}\vec{r} - \frac{\vec{a}}{|\vec{r}|^3}\right\} \tag{21}$$

From formula (21), $b_x$ is expressed as in formula (22) below, where $r_x$, $r_y$, $r_z$ are x-, y-, z-components of the vector "r", respectively, and also $a_x$, $a_y$, $a_z$ are x-, y-, z-components of the vector "a", respectively.

$$b_x = \frac{\mu_0}{4\pi}\left\{\left(\frac{3r_x^2}{|\vec{r}|^5} - \frac{1}{|\vec{r}|^3}\right)a_x + \frac{3r_xr_y}{|\vec{r}|^5}a_y + \frac{3r_zr_x}{|\vec{r}|^5}a_z\right\} \tag{22}$$

$$b_x = h_{xx}(\vec{r})a_x + h_{xy}(\vec{r})a_y + h_{xz}(\vec{r})a_z \tag{22'}$$

Here, when the coefficients of $a_x$, $a_y$, and $a_z$ in formula (22) are replaced, respectively, with $h_{xx}$, $h_{xy}$, and $h_{xz}$ (the argument is the vector "r"), the formula (22) is expressed as in formula (22').

From formula (21), $b_y$ is expressed as in formula (23) below.

$$b_y = \frac{\mu_0}{4\pi}\left\{\frac{3r_xr_y}{|\vec{r}|^5}a_x + \left(\frac{3r_y^2}{|\vec{r}|^5} - \frac{1}{|\vec{r}|^3}\right)a_y + \frac{3r_yr_z}{|\vec{r}|^5}a_z\right\} \tag{23}$$

-continued $$b_y = h_{yx}(\vec{r})a_x + h_{yy}(\vec{r})a_y + h_{yz}(\vec{r})a_z \tag{23'}$$

Here, when the coefficients of $a_x$, $a_y$, and $a_z$ in formula (23) are replaced, respectively, with $h_{yx}$, $h_{yy}$, and $h_{yz}$ (the argument is the vector "r"), the formula (23) is expressed as in formula (23').

From formula (21), $b_z$ is expressed as in formula (24) below.

$$b_z = \frac{\mu_0}{4\pi}\left\{\frac{3r_zr_x}{|\vec{r}|^5}a_x + \frac{3r_yr_z}{|\vec{r}|^5}a_y + \left(\frac{3r_z^2}{|\vec{r}|^5} - \frac{1}{|\vec{r}|^3}\right)a_z\right\} \tag{24}$$

$$b_z = h_{zx}(\vec{r})a_x + h_{zy}(\vec{r})a_y + h_{zz}(\vec{r})a_z \tag{24'}$$

Here, when the coefficients of $a_x$, $a_y$, and $a_z$ in formula (24) are replaced, respectively, with $h_{zx}$, $h_{zy}$, and $h_{zz}$ (the argument is the vector "r"), the formula (24) is expressed as in formula (24').

Here, $b_x$, $b_y$, and $b_z$ are expressed as in formula (25) below.

$$b_x = \begin{pmatrix} b_{x1} \\ \vdots \\ b_{x64} \end{pmatrix},\ b_y = \begin{pmatrix} b_{y1} \\ \vdots \\ b_{y64} \end{pmatrix},\ b_z = \begin{pmatrix} b_{z1} \\ \vdots \\ b_{z64} \end{pmatrix} \tag{25}$$

That is, $b_x$ is a one-column matrix in which the X components of measurement results from the magnetic sensors MS1 to MS64 are summarized. $b_y$ is a one-column matrix in which the Y components of measurement results from the magnetic sensors MS1 to MS64 are summarized. $b_z$ is a one-column matrix in which the Z components of measurement results from the magnetic sensors MS1 to MS64 are summarized. For example, $b_{x1}$, $b_{y1}$, $b_{z1}$ are the X, Y, Z components of a measurement result from the magnetic sensor MS1, and $b_{x64}$, $b_{y64}$, $b_{z64}$ are the X, Y, Z components of a measurement result from the magnetic sensor MS64.

Here, the measurement results are summarized per X, Y, Z axis by the number (64) of the magnetic sensors MS as a one-column matrix "b" that consists of $b_x$, $b_y$, $b_z$ (see the left side of formula (28) and the left side of formula (28')).

$a_x$, $a_y$, and $a_z$ are also expressed as in formula (26) below.

$$a_x = \begin{pmatrix} a_{x1} \\ \vdots \\ a_{x1000} \end{pmatrix},\ a_y = \begin{pmatrix} a_{y1} \\ \vdots \\ a_{y1000} \end{pmatrix},\ a_z = \begin{pmatrix} a_{z1} \\ \vdots \\ a_{z1000} \end{pmatrix} \tag{26}$$

That is, each of the components $a_x$, $a_y$, $a_z$ of the vector "a" is a one-column matrix that has components by the number (1000) of the grid points (voxels) in the space at which the signal sources S1, S2 are positioned. For example, $a_{x1}$, $a_{y1}$, $a_{z1}$ are the X, Y, Z components of the vector "a" at the voxel V1, and $a_{x1000}$, $a_{y1000}$, $a_{z1000}$ are the X, Y, Z components of the vector "a" at the voxel V1000.

Here, the vector "a" is a one-column matrix. In addition, the components $a_x$, $a_y$, $a_z$ of the vector "a" are summarized per X, Y, Z axis by the number (1000) of the grid points in the space at which the signal sources are positioned (see the right-hand matrices in the right sides of formulae (28) and (28')).

Referring to FIG. 5, the signal source specifying apparatus 1 according to the second embodiment includes a relative position recording section 110, a lead-field matrix deriving section 120, a lead-field matrix recording section 130, and a position/vector deriving section 150.

The signal source specifying apparatus 1 is arranged to receive measurement results from the multiple sensors MS1 to MS64 and specify the positions of the signal sources S1, S2 and the vector "a".

The relative position recording section 110 is arranged to record a vector "r" as a relative position between each of the 1000 voxels V and each of the magnetic sensors MS (MS1 to MS64).

The lead-field matrix deriving section 120 is arranged to read the vector "r" from the relative position recording section 110 and obtain $h_{xx}$, $h_{xy}$, $h_{xz}$, $h_{yx}$, $h_{yy}$, $h_{yz}$, $h_{zx}$, $h_{zy}$, $h_{zz}$ (the argument is the vector "r") (components of a relational matrix "H" to be described hereinafter (e.g. a lead-field matrix)) (see formulae (22) to (24) and (22') to (24')).

For example, $h_{xx}$ is expressed as in formula (27) below.

$$h_{xx}(\vec{r}) = \begin{pmatrix} h_{xx}(1,1) & \cdots & h_{xx}(1,1000) \\ \vdots & \ddots & \vdots \\ h_{xx}(64,1) & \cdots & h_{xx}(64,1000) \end{pmatrix} \tag{27}$$

The vector "r" is determined by the position of each voxel V and the position of each magnetic sensor MS and thereby has 1000×64 different candidate values. Accordingly, the first coefficient $v_{x1}$ also has 1000×64 different candidate values. In formula (27), the 1st row denotes $h_{xx}$ for the magnetic sensor MS1, the 2nd row denotes $h_{xx}$ for the magnetic sensor MS2, . . . , and the 64th row denotes $h_{xx}$ for the magnetic sensor MS64. Further, in formula (27), the 1st column denotes $h_{xx}$ for the voxel V1, the 2nd column denotes $h_{xx}$ for the voxel V2, . . . , and the 1000th column denotes $h_{xx}$ for the voxel V1000. For example, the element $h_{xx}$ (1, 1000) of the 1st row and the 1000th column in formula (27) denotes $h_{xx}$ for the magnetic sensor MS1 and the voxel V1000. That is, $h_{xx}$ (1, 1000) can be obtained by substituting the vector "r" as a directional vector from the voxel V1000 to the magnetic sensor MS1 into the coefficient of $a_x$ in formula (22).

$h_{xy}$, $h_{xz}$, $h_{yx}$, $h_{yy}$, $h_{yz}$, $h_{zx}$, $h_{zy}$, $h_{zz}$ also each have 1000×64 different candidate values.

Here, formulae (22') to (24') can be expressed as in formula (28) below.

$$\begin{bmatrix} b_x \\ b_y \\ b_z \end{bmatrix} = \begin{bmatrix} h_{xx}(\vec{r}) & h_{xy}(\vec{r}) & h_{xz}(\vec{r}) \\ h_{yx}(\vec{r}) & h_{yy}(\vec{r}) & h_{yz}(\vec{r}) \\ h_{zx}(\vec{r}) & h_{zy}(\vec{r}) & h_{zz}(\vec{r}) \end{bmatrix} \begin{bmatrix} a_x \\ a_y \\ a_z \end{bmatrix} \tag{28}$$

$$b = Ha \tag{28'}$$

The left side of formula (28) is also defined as "b" (i.e. measurement results summarized per X, Y, Z axis by the number (64) of the magnetic sensors). The measurement result "b" is a one-column matrix.

Further, the right-hand matrix in the right side of formula (28) is the vector "a" (the components $a_x$, $a_y$, $a_z$ of the vector "a" are summarized per X, Y, Z axis by the number (1000) of grid points in the space at which the signal sources S1, S2 are positioned). The vector "a" is a one-column matrix.

The left-hand matrix in the right side of formula (28) is defined as "H". "H" is a relational matrix (e.g. a lead-field matrix) that represents the relationship between the measurement result "b" and the vector "a".

Formula (28) can then be expressed as in formula (28'). That is, the measurement result "b" is a product of the relational matrix "H" and the vector "a".

As described heretofore, the lead-field matrix deriving section 120 is arranged to obtain components of the relational matrix "H" and further derive the relational matrix (the lead-field matrix) "H".

The lead-field matrix recording section 130 is arranged to receive and record the relational matrix (the lead-field matrix) "H" from the lead-field matrix deriving section 120.

The position/vector deriving section 150 is arranged to derive the positions of the signal sources S1, S2 and the vector "a" that offer a minimum cost function based on the measurement result "b" and the relational matrix "H".

That is, the position/vector deriving section 150 is arranged to derive the vector "a" that satisfies formula (29) below.

$$a = \underset{a}{\operatorname{argmin}}\left[\frac{1}{2}(b - Ha)^T(b - Ha) + \lambda\|a\|_1\right] \tag{29}$$

The cost function is the sum of the error function and the normalization term.

The error function represents the positions of the signal sources S1, S2 and an error between a true value of the vector "a" and a candidate value for the true value. The error function is a function of the measurement result "b", the relational matrix "H", and the candidate value "a" (for the true value of the vector). The error function is, for example, $(1/2)(b-Ha)^T(b-Ha)$.

The normalization term is a function of a normalization parameter λ and an L1 norm of the vector "a". For example, the normalization term is a product of a normalization parameter λ and an L1 norm of the vector "a".

The positions of the signal sources S1, S2 and the vector "a" are specified based on a result "a" of derivation by the position/vector deriving section 150. For example, the result "a" of derivation by the position/vector deriving section 150 is specified as the positions of the signal sources and the vector. For example, when the signal source S1 is positioned within the voxel V500 and the signal source S2 is positioned within the voxel V600, ($a_{x500}$, $a_{y500}$, $a_{z500}$) in the result "a" of derivation is the signal vector output from the signal source S1 and ($a_{x600}$, $a_{y600}$, $a_{z600}$) is the signal vector output from the signal source S2.

Next will be described an operation according to the second embodiment.

The lead-field matrix deriving section 120 reads a vector "r" out of the relative position recording section 110 and derives components $h_{xx}$, $h_{xy}$, $h_{xz}$, $h_{yx}$, $h_{yz}$, $h_{zx}$, $h_{zy}$, $h_{zz}$ of a relational matrix (a lead-field matrix) "H" (see formulae (22) to (24) and (22') to (24')).

The lead-field matrix recording section 130 receives and records the relational matrix "H" from the lead-field matrix deriving section 120.

The position/vector deriving section 150 derives the positions of the signal sources S1, S2 and the vector "a" that offer a minimum cost function based on the measurement result "b" and the relational matrix "H" (see formula (29)).

In accordance with the second embodiment, the accuracy of estimating the positions of multiple signal sources (including coherent signal sources) is improved. That is, since the second embodiment is based on the Lasso method, it is possible to estimate the position of even a coherent signal source. Additionally, in accordance with the second embodiment, since the measurement result "b" and the vector "a" are summarized per X, Y, Z axis (see formulae (28) and (28')) and such triaxial measurement results can be utilized, the accuracy of estimating the positions of multiple signal sources is improved.

Third Embodiment

The signal source specifying apparatus 1 according to a third embodiment differs from the signal source specifying apparatus 1 according to the second embodiment in that a clustering section 180*a*, a weighted center deriving section 180*b*, and a weighted averaging section 180*c* are included.

Figure 6:
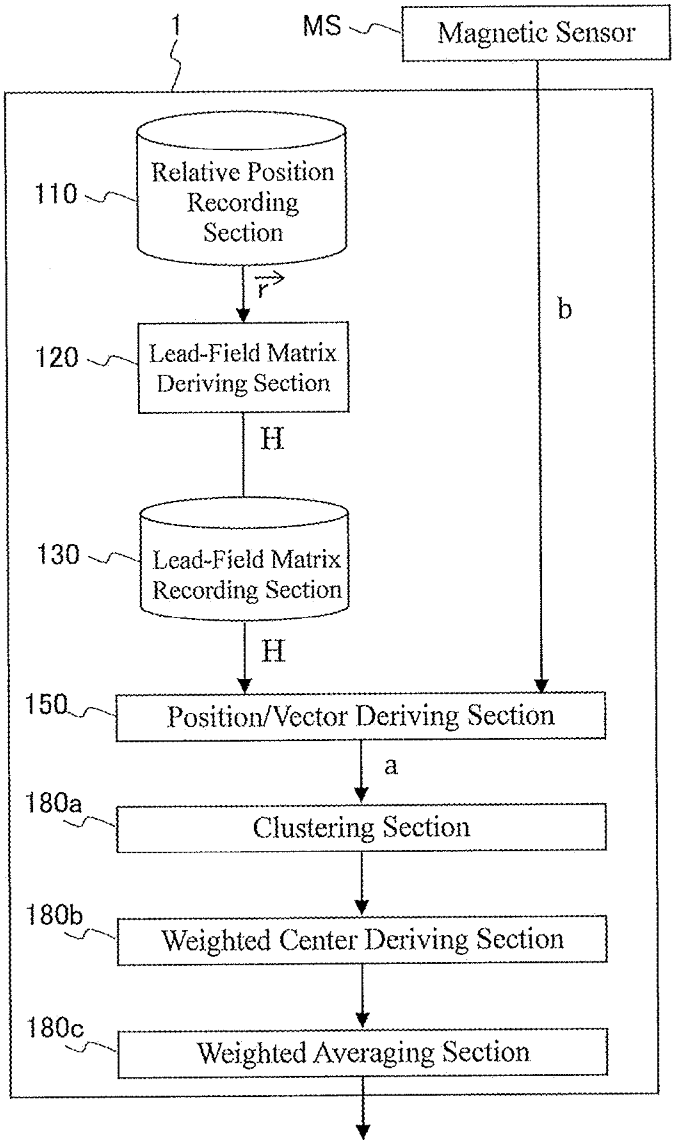
FIG. 6 is a functional block diagram showing a configuration of the signal source specifying apparatus 1 according to a third embodiment of the present invention.

FIG. 6 is a functional block diagram showing the configuration of the signal source specifying apparatus 1 according to the third embodiment of the present invention. The signal source specifying apparatus 1 according to the third embodiment includes a relative position recording section 110, a lead-field matrix deriving section 120, a lead-field matrix recording section 130, a position/vector deriving section 150, a clustering section 180*a*, a weighted center deriving section 180*b*, and a weighted averaging section 180*c*.

The relative position recording section 110, the lead-field matrix deriving section 120, the lead-field matrix recording section 130, and the position/vector deriving section 150 are the same as those in the second embodiment and will not be described.

Figure 7A:
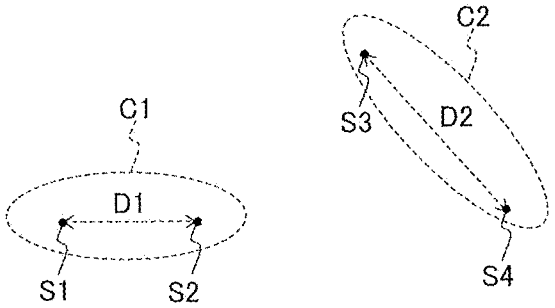
FIGS. 7 (*a*), 7 (*b*) and 7 (*c*) show clustering of positions of signal sources S1 to S4 by a clustering section 180*a* (FIG. 7 (*a*)), derivation of weighted centers of clusters by a weighted center deriving section 180*b* (FIG. 7 (*b*)), and derivation of weighted averages of vectors by a weighted averaging section 180*c* (FIG. 7 (*c*))
Figure 7B:
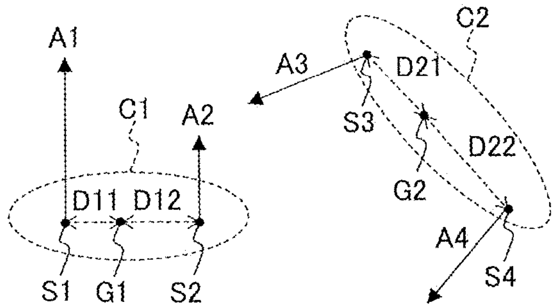
Figure 7C:
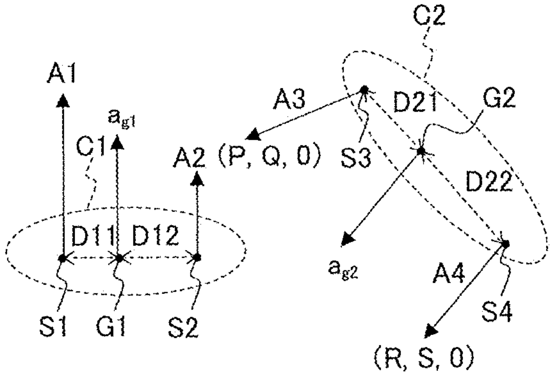

FIG. 7 shows clustering of the positions of signal sources S1 to S4 by the clustering section 180*a* (FIG. 7 (*a*)), derivation of the weighted centers of clusters by the weighted center deriving section 180*b* (FIG. 7 (*b*)), and derivation of the weighted averages of vectors by the weighted averaging section 180*c* (FIG. 7 (*c*)). Note here that the signal sources S1, S2 are not shown in FIGS. 7 (*b*) and 7 (*c*).

Referring to FIG. 7 (*c*), the position G1 represents the true position of a signal source and $a_{g1}$ represents the signal vector. However, when the position G1 does not correspond to a voxel, the positions of signal sources are erroneously derived as S1 and S2. Further, the signal vectors are erroneously derived as A1 and A2.

Further, the position G2 represents the true position of a signal source and $a_{g2}$ represents the signal vector. However, when the position G2 does not correspond to a voxel, the positions of signal sources are erroneously derived as S3 and S4. Further, the signal vectors are erroneously derived as A3 and A4.

Such results of derivation (S1 to S4 and A1 to A4) by the position/vector deriving section 150 are used to obtain the true positions G1, G2 of signal sources and the true signal vectors $a_{g1}$, $a_{g2}$.

First, referring to FIG. 7 (*a*), the clustering section 180*a* is arranged to classify the positions of signal sources S1 to S4 derived by the position/vector deriving section 150 into (two) clusters of the number of signal sources. In the example of FIG. 7 (*a*), the positions of signal sources S1 and S2 are classified into a cluster C1 and the positions of signal sources S3 and S4 are classified into a cluster C2. It is noted that the distance between the positions of signal sources S1 and S2 is defined as D1 and the distance between the positions of signal sources S3 and S4 is defined as D2.

Next, referring to FIG. 7 (*b*), the weighted center deriving section 180*b* is arranged to derive the weighted center of signal sources for each of the clusters. The weighted center G1 of signal sources in the cluster C1 is on a line segment connecting the positions of the signal sources S1 and S2. It is noted that S1G1/S2G1=(the magnitude of A2)/(the magnitude of A1). The weighted center G2 of signal sources in the cluster C2 is on a line segment connecting the positions of the signal sources S3 and S4. It is noted that S3G2/S4G2=(the magnitude of A4)/(the magnitude of A3).

It is noted that the classification into clusters may be performed according to a K-means method. In this case, two weighted centers are first randomly arranged, and then the positions of the signal sources S1 to S4 are classified into clusters according to the distances between the weighted centers and the positions of the signal sources S1 to S4.

Further, the weighted centers of the signal sources are derived for each of the clusters, and then the positions of the signal sources S1 to S4 are classified into clusters according to the distances between the weighted centers derived and the positions of the signal sources S1 to S4. Such derivation of weighted centers and classification into clusters are repeated until the weighted centers derived are in the same positions, respectively, as the weighted centers just before the derivation.

The positions of the signal sources are specified as the weighted centers G1, G2 thus derived.

Further, referring to FIG. 7 (*c*), the weighted averaging section 180*c* is arranged to average, for each of the clusters, the vector "a" that is derived by the position/vector deriving section 150 in inverse proportion to the distances between the signal sources and the weighted centers.

Taking the cluster C2 as an example, if vector A3 is (P, Q, 0) and the vector A4 is (R, S, 0), the true signal vector $a_{g2}$ is defined as ((P*D22+R*D21)/D2, (Q*D22+S*D21)/D2, 0). It is noted that the same applies to the cluster C1 and the description thereof is omitted.

The signal vector is specified as the weighted average ((P*D22+R*D21)/D2, (Q*D22+S*D21)/D2, 0) thus derived.

Next will be described an operation according to the third embodiment.

First, the relative position recording section 110, the lead-field matrix deriving section 120, the lead-field matrix recording section 130, and the position/vector deriving section 150 are the same as those in the second embodiment and will not be described.

An output from the position/vector deriving section 150 is provided to the clustering section 180*a* and the positions of signal sources S1 to S4 are clustered (see FIG. 7 (*a*)). Next, the weighted center deriving section 180*b* derives the weighted centers of clusters C1, C2 (see FIG. 7 (*b*)). The weighted centers G1, G2 are true positions of the signal sources. Finally, the weighted averaging section 180*c* derives the weighted averages of vectors (see FIG. 7 (*c*)). The weighted averages $a_{g1}$, $a_{g2}$ are true signal vectors.

In accordance with the third embodiment, even when the position of a signal source does not correspond to a voxel, the position of the signal source and the signal vector can be obtained.

It is noted that the signal may be an electric dipole moment, though have been a magnetic dipole moment in the above-described embodiments.

It is also noted that the measurement result "b" may be raised to the κ-th power to be a product of the κ-th power of the relational matrix "H" and the vector "a", though have been a product of the relational matrix "H" and the vector "a" in the above-described embodiments (where $\kappa>1$) (see formula (30) below).

$$b^{\kappa}=H^{\kappa}a \quad (30)$$

While the vector "a" have been a function of the measurement result "b" and the relational matrix "H" in the above-described embodiments (e.g. a=f(b, H)), when the κ-th power of the measurement result "b" is a product of the κ-th power of the relational matrix "H" and the vector "a", it is possible to derive the vector "a" by plugging in the κ-th power of "b" and the κ-th power of "H", respectively, for "b" and "H" of a=f(b, H).

Fourth Embodiment

A fourth embodiment relates to an image output apparatus 20 that includes a signal source specifying apparatus 1 according to one of the first, second, and third embodiments as a signal source specifying section 22.

Figure 8:
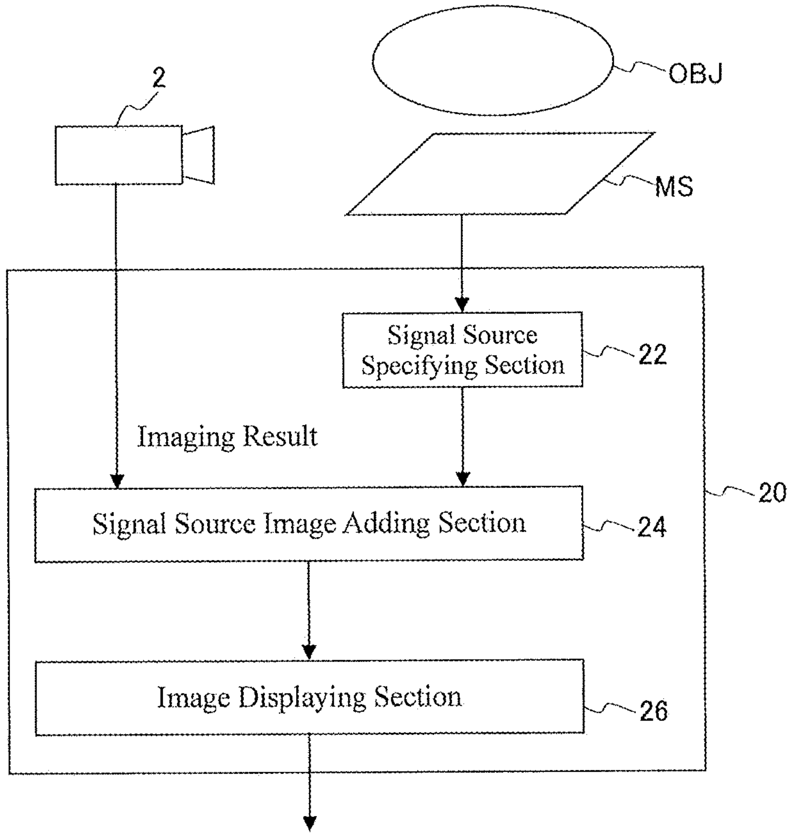
FIG. 8 is a functional block diagram showing a configuration of an image output apparatus 20 according to a fourth embodiment.

FIG. 8 is a functional block diagram showing the configuration of the image output apparatus 20 according to the fourth embodiment. The image output apparatus 20 according to the fourth embodiment includes a signal source specifying section 22, a signal source image adding section 24, and an image displaying section 26.

The signal source specifying section 22 is arranged to receive measurement results from multiple sensors (magnetic sensors MS) that receive, from multiple signal sources S1, S2, signals represented by vectors each having a predetermined direction and measure triaxial components orthogonal to each other to specify the positions of the signal sources S1, S2 and the directions of the vectors. The positions of the signal sources S1, S2 and the directions of the vectors are provided to the signal source image adding section 24.

The signal source specifying section 22 can employ a signal source specifying apparatus 1 according to one of the first, second, and third embodiments. It is noted that an object OBJ includes the multiple signal sources S1, S2. The signal sources S1, S2 include, for example, a magnetic marker (such as a permanent magnet) and a magnetic material (such as a rebar). In general, the signal sources S1, S2 or the directions of the vectors cannot be perceived even by visually observing the object OBJ.

An imaging section 2 (e.g. a camera) is arranged to image the signal sources S1, S2 with the object OBJ including them. In general, the signal sources S1, S2 or the directions of the vectors cannot be perceived even by observing an imaging result from the imaging section 2. The imaging result from the imaging section 2 only includes the object OBJ and the magnetic sensor MS. The imaging result from the imaging section 2 is provided to the signal source image adding section 24.

The signal source image adding section 24 is arranged to add images showing the signal sources S1, S2 to portions of the imaging result from the imaging section 2, the portions corresponding to the positions of the signal sources S1, S2 that are specified by the signal source specifying section 22.

The image displaying section 26 is arranged to display the result of addition by the signal source image adding section 24.

Figure 9:
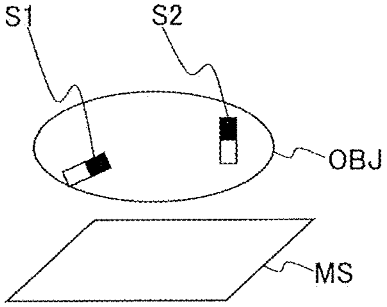
FIG. 9 shows an example of display by an image displaying section 26.

FIG. 9 shows an example of display by the image displaying section 26. The images (rectangles each painted into white and black) showing the signal sources S1, S2 are added to the imaging result (including the object OBJ and the magnetic sensor MS) from the imaging section 2. It is noted that the black-filled portion indicates the N pole and the white-filled portion indicates the S pole in the image showing the signal sources S1, S2. In the image showing the signal sources S1, S2, as the N pole and the S pole are known, the direction of the magnetic vector is also known.

Next will be described an operation according to the fourth embodiment.

The imaging section 2 images the signal sources S1, S2 with the object OBJ including them and provides the result to the signal source image adding section 24.

Upon receiving signals represented by magnetic vectors each having a predetermined direction from the signal sources S1, S2, the magnetic sensor MS measures triaxial components orthogonal to each other. The results of measurement are provided to the signal source specifying section 22 to obtain the positions of the signal sources S1, S2 and the directions of the vectors. The positions of the signal sources S1, S2 and the directions of the vectors are provided to the signal source image adding section 24.

The signal source image adding section 24 adds images showing the signal sources S1, S2 to portions of the imaging result from the imaging section 2, the portions corresponding to the positions of the signal sources S1, S2 that are specified by the signal source specifying section 22. The result of addition is provided to the image displaying section 26 for display as an image (see FIG. 9).

In accordance with the fourth embodiment, it is possible to visualize signal sources S1, S2 such as a magnetic field.

It is noted that the fourth embodiment can have the following variations 1, 2, and 3.

First Variation

Figure 10:
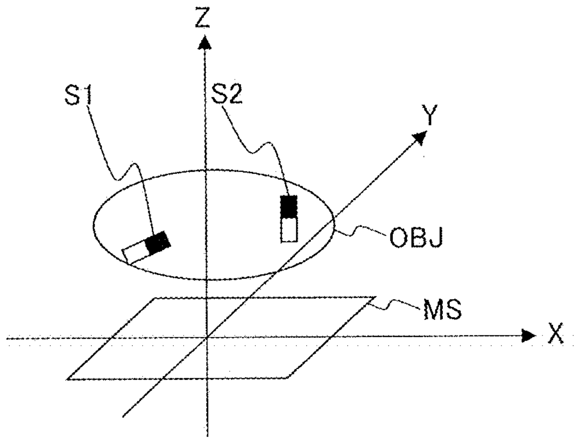
FIG. 10 shows an example of display by the image displaying section 26 according to a first variation of the fourth embodiment.

FIG. 10 shows an example of display by the image displaying section 26 according to a first variation of the fourth embodiment. The signal source image adding section 24 is arranged to further add coordinate axes X, Y, and Z to the imaging result.

Second Variation

Figure 11:
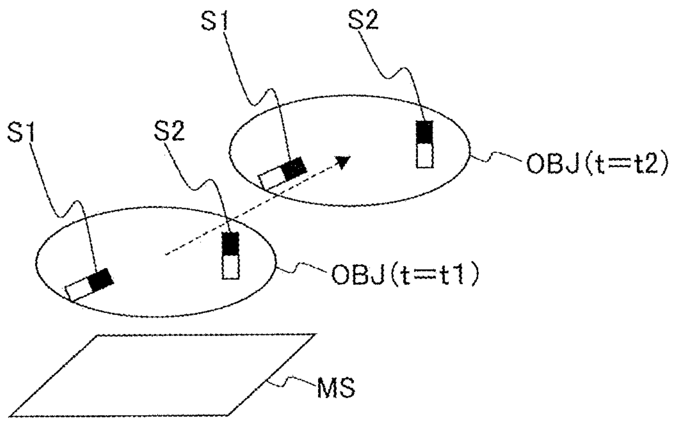
FIG. 11 shows an example of display by the image displaying section 26 according to a second variation of the fourth embodiment.

FIG. 11 shows an example of display by the image displaying section 26 according to a second variation of the fourth embodiment. The signal source image adding section 24 is arranged to add images showing the signal sources S1, S2 at multiple time points (e.g. time points t1, t2). For example, referring to FIG. 11, it is assumed that the signal sources S1, S2 had moved in the direction indicated by the dashed arrow with the object OBJ including them. In this case, images showing the signal sources S1, S2 are added to the imaging result (including the object OBJ and the magnetic sensor MS) at a time point t1, and further images showing the signal sources S1, S2 are added to the imaging result (including the object OBJ and the magnetic sensor MS) at a time point t2 (>11).

Third Variation

It is noted that the signal source image adding section 24 may be arranged to output, based on the coordinates of the positions of the signal sources S1, S2 and the coordinate of a viewpoint of imaging by the imaging section 2, an additional result when the viewpoint is changed.

The above-described embodiment may also be implemented as follows. A computer including a CPU, a hard disk, and a medium (USB memory, CD-ROM, or the like) reading device is caused to read a medium with a program recorded thereon that achieves the above-described components (e.g. the signal source specifying section 22 and the signal source image adding section 24) and install the program in the hard disk. The above-described features can also be achieved in this manner.

DESCRIPTION OF REFERENCE NUMERAL

1 Signal Source Specifying Apparatus
2 Imaging Section
20 Image Output Apparatus
22 Signal Source Specifying Section
24 Signal Source Image Adding Section
26 Image Displaying Section
OBJ Object
MS Magnetic Sensor
S1, S2 Signal Sources
X, Y, and Z Coordinate Axes
t1, t2 Time Point

The invention claimed is:

1. An image output apparatus, comprising:
a signal source specifying section arranged to receive measurement results from a plurality of sensors that receive, from a plurality of signal sources, signals represented by vectors each having a predetermined direction and measure triaxial components orthogonal to each other to specify positions of the signal sources and the directions of the vectors; and
a signal source image adding section arranged to add images showing the signal sources to portions of an imaging result from an imaging section arranged to image the signal sources, the portions corresponding to the positions of the signal sources that are specified by the signal source specifying section, wherein
the measurement results from the sensors are each proportional to a sum of the triaxial components of each vector multiplied by a first coefficient, and
the signal source specifying section comprises:
a spectrum deriving section arranged to derive a spectrum obtained based on a sum of the measurement results from the sensors and a value obtained by multiplying the first coefficient by a second coefficient, the spectrum having local maximum values in voxels in which the signal sources that output the signals exist;
a direction deriving section arranged to derive the directions of the vectors based on the second coefficient that is used to obtain the spectrum; and
a position deriving section arranged to derive the positions of the voxels in which the signal sources exist based on the spectrum.

2. The image output apparatus according to claim 1, wherein
the signal source image adding section is arranged to further add a coordinate axis to the imaging result.

3. The image output apparatus according to claim 1, wherein
the images showing the signal sources indicate the directions of the vectors.

4. The image output apparatus according to claim 1, wherein
the signal source image adding section is arranged to add images showing the signal sources at a plurality of time points.

5. The image output apparatus according to claim 1, wherein
the signal source image adding section is arranged to output, based on the coordinates of the positions of the signal sources and the coordinate of a viewpoint of imaging by the imaging section, an additional result when the viewpoint is changed.

6. The image output apparatus according to claim 1, wherein
the position deriving section is arranged to derive the positions of the voxels in which the signal sources exist based on the maximum of a value that the spectrum has in each voxel.

7. An image output apparatus, comprising:
a signal source specifying section arranged to receive measurement results from a plurality of sensors that receive, from a plurality of signal sources, signals represented by vectors each having a predetermined direction and measure triaxial components orthogonal to each other to specify positions of the signal sources and the directions of the vectors; and
a signal source image adding section arranged to add images showing the signal sources to portions of an imaging result from an imaging section arranged to image the signal sources, the portions corresponding to the positions of the signal sources that are specified by the signal source specifying section, wherein
the signal source specifying section comprises:
a relational matrix recording section arranged to record a relational matrix that represents a relationship between the measurement results summarized per axis by a number of the sensors and the vectors; and
a position/vector deriving section arranged to derive the positions of the signal sources and the vectors that offer a minimum cost function based on the measurement results and the relational matrix, wherein
the components of the vectors are summarized per the axis by a number of grid points in a space at which the signal sources are positioned,
the cost function is a sum of an error function and a normalization term,
the error function represents the positions of the signal sources and an error between a true value of each vector and a candidate value for the true value,
the normalization term is a function of a normalization parameter and an L1 norm of each vector, and
the positions of the signal sources and the vectors are specified based on a result of derivation by the position/vector deriving section.

8. The image output apparatus according to claim 7, wherein
the result of derivation by the position/vector deriving section is specified as the positions of the signal sources and the vectors.

9. The image output apparatus according to claim 7, further comprising:
a clustering section arranged to classify the positions of the signal sources that are derived by the position/vector deriving section into clusters of a number of the signal sources;
a weighted center deriving section arranged to derive a weighted center of the signal sources for each of the clusters; and
a weighted averaging section arranged to average, for each of the clusters, the vectors that are derived by the position/vector deriving section in inverse proportion to distances between the signal sources and the weighted center, wherein
the positions of the signal sources are each specified as the weighted center, and
the vectors are each specified as a result of derivation by the weighted averaging section.

10. The image output apparatus according to claim 9, wherein the classification into the clusters is performed according to a K-means method.

11. The image output apparatus according to claim 7, wherein the signal source image adding section is arranged to further add a coordinate axis to the imaging result.

12. The image output apparatus according to claim 7, wherein the images showing the signal sources indicate the directions of the vectors.

13. The image output apparatus according to claim 7, wherein the signal source image adding section is arranged to add images showing the signal sources at a plurality of time points.

14. The image output apparatus according to claim 7, wherein the signal source image adding section is arranged to output, based on the coordinates of the positions of the signal sources and the coordinate of a viewpoint of imaging by the imaging section, an additional result when the viewpoint is changed.

15. An image output method, comprising:

receiving measurement results from a plurality of sensors that receive, from a plurality of signal sources, signals represented by vectors each having a predetermined direction and measure triaxial components orthogonal to each other to specify positions of the signal sources and the directions of the vectors; and adding images showing the signal sources to portions of an imaging result from an imaging section arranged to image the signal sources, the portions corresponding to the positions of the signal sources that are specified by the receiving of the measurement results, wherein the measurement results from the sensors are each proportional to a sum of the triaxial components of each vector multiplied by a first coefficient, and wherein specifying positions of the signal sources and the directions of the vectors is performed by deriving a spectrum obtained based on a sum of the measurement results from the sensors and a value obtained by multiplying the first coefficient by a second coefficient, the spectrum having local maximum values in voxels in which the signal sources that output the signals exist;

deriving the directions of the vectors based on the second coefficient that is used to obtain the spectrum; and deriving the positions of the voxels in which the signal sources exist based on the spectrum.

16. An image output method, comprising:

receiving measurement results from a plurality of sensors that receive, from a plurality of signal sources, signals represented by vectors each having a predetermined direction and measure triaxial components orthogonal to each other to specify positions of the signal sources and the directions of the vectors; and adding images showing the signal sources to portions of an imaging result from an imaging section arranged to image the signal sources, the portions corresponding to the positions of the signal sources that are specified by the receiving of the measurement results, wherein specifying positions of the signal sources and the directions of the vectors is performed by recording a relational matrix that represents a relationship between the measurement results summarized per axis by a number of the sensors and the vectors; and deriving the positions of the signal sources and the vectors that offer a minimum cost function based on the measurement results and the relational matrix, wherein the components of the vectors are summarized per the axis by a number of grid points in a space at which the signal sources are positioned, the cost function is a sum of an error function and a normalization term, the error function represents the positions of the signal sources and an error between a true value of each vector and a candidate value for the true value, the normalization term is a function of a normalization parameter and an L1 norm of each vector, and the positions of the signal sources and the vectors are specified based on a result of derivation by the position/vector deriving section.

* * * * *